US006825101B1

United States Patent
Hawryluk et al.

(10) Patent No.: US 6,825,101 B1
(45) Date of Patent: Nov. 30, 2004

(54) METHODS FOR ANNEALING A SUBSTRATE AND ARTICLE PRODUCED BY SUCH METHODS

(75) Inventors: Andrew M. Hawryluk, Los Altos Hills, CA (US); David A. Markle, Saratoga, CA (US); Somit Talwar, Bonita, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 09/536,927

(22) Filed: Mar. 27, 2000

(51) Int. Cl.$^7$ ............................................. H01L 21/20
(52) U.S. Cl. ....................... 438/483; 486/515; 486/516; 486/520
(58) Field of Search ................................ 438/483, 486, 438/515, 516, 520

(56) References Cited

U.S. PATENT DOCUMENTS

| | | | | | |
|---|---|---|---|---|---|
| 4,402,762 | A | * | 9/1983 | John et al. .................. | 438/482 |
| 5,399,506 | A | * | 3/1995 | Tsukamoto ................. | 438/301 |
| 5,624,873 | A | * | 4/1997 | Fonash et al. .............. | 438/487 |
| 5,888,888 | A | | 3/1999 | Talwar et al. ............... | 438/533 |
| 6,111,260 | A | * | 8/2000 | Dawson et al. ......... | 250/492.21 |
| 6,238,587 | B1 | * | 5/2001 | Siniaguine et al. ........... | 216/59 |
| 6,762,136 | B1 | * | 7/2004 | Bollinger et al. ........... | 438/795 |
| 2002/0031889 | A1 | * | 3/2002 | Nishihara et al. ........... | 438/280 |

FOREIGN PATENT DOCUMENTS

JP        06340500 A1 * 12/1994        H01I/21/20

OTHER PUBLICATIONS

Wolf, "Isolation Technologies for Integrated Circuits," Silicon Processing for the VLSI Era—vol. 2: Process Integration, Lattice Press, 1990, pp. 66–78.*

Kramer et al., "Characterization of Reverse Leakage Components for Ultrashallow p+/n Diodes Fabricated Using Gas Immersion Laser Doping," IEEE Electron Device Letters, vol. 17, No. 10, Oct. 1996, pp. 461–463.*

Michael O. Thompson and T. J. Renk, Numerical Modeling and Experimental Measurements of Pulsed Ion Beam surface Treatment, Mat. Res. Soc. Symp. Proc. vol. 504, 1998, pp 33–38.

T. J. Renk, et al., Improvement of surface properties by modification and alloying with high–power ion beams, Physics of Plasmas, vol. 5, No. 5, May 1998, pp 2144–2150.

* cited by examiner

Primary Examiner—Mary Wilczewski
Assistant Examiner—Toniae M. Thomas
(74) Attorney, Agent, or Firm—Allston L. Jones (57) ABSTRACT

A method of this invention includes annealing at least one region of a substrate with a short pulse of particles. The particles can be electrons, protons, alpha particles, other atomic or molecular ions or neutral atoms and molecules. The substrate can be composed of a semiconductor material, for example. The particles can include dopant atoms such as p-type dopant atoms such as boron (B), aluminum (Al), gallium (Ga), or indium (In), and n-type dopant atomic species including arsenic (As), phosphorus (P), or antimony (Sb). The particles can also include silicon (Si) or germanium (Ge) atoms or ionized gas atoms including those of hydrogen (He), oxygen (O), nitrogen (N), neon (Ne), argon (Ar), or krypton (Kr). The particles can be used to anneal dopant atoms previously implanted into the substrate. Alternatively, the particle species can be chosen to include the desired implant dopant, the energy of the particle may be chosen to achieve the desired implant depth, and the energy, dose and pulse duration may be chosen to anneal the implanted region during the pulse. This embodiment of the method performs implantation and activation in a single step. If no change in the electrical state of the substrate is required, the particles can include silicon (Si), and germanium (Ge) atoms.

65 Claims, 4 Drawing Sheets

METHODS FOR ANNEALING A SUBSTRATE AND ARTICLE PRODUCED BY SUCH METHODS

BACKGROUND OF THE INVENTION

1. Field of the Invention

This invention is directed to methods for annealing a substrate using a pulse of particles such as electrons, protons, ions, or other, neutral particles. The invention is also directed to integrated devices or circuits made by such methods. The substrate can be composed of silicon, gallium arsenide, or other semiconductor species, or can include an insulative material with a relatively thin-film of semiconductor material formed thereon. The apparatus and methods can be used to anneal or activate integrated devices or circuits formed in the substrate, and to form low-resistance suicide regions thereon. Such integrated devices can include active devices such as transistors or diodes, or passive devices such as resistors or capacitors. For example, the apparatus and method can be used to anneal a substrate to obtain a relatively high crystalline state therein, or to activate the substrate to incorporate dopant atoms into the substrate's crystalline lattice, to achieve proper electrical performance of the integrated devices.

2. Description of the Related Art

In forming integrated devices in a semiconductor substrate it is common to use ion implantation to introduce dopant atoms of appropriate species into the substrate to form n-type or p-type regions. Immediately after implantation the dopant atoms are not generally positioned within the substrate where they can be useful to achieve proper electrical performance of the integrated device being formed. Also, the dopant atoms are accelerated to relatively high-energies by ion implanters. Therefore, upon colliding with the substrate the dopant atoms cause considerable damage to the substrate by breaking chemical bonds therein. The crystalline structure of the substrate must be restored, and the dopant atoms incorporated into it, in order to obtain proper electrical performance of the integrated devices. Annealing is typically performed by heating the substrate so that the dopant atoms and substrate atoms have sufficient energy to realign. Of considerable importance in the manufacture of integrated devices or circuits is the "throughput" that a manufacturer can obtain with a process for forming integrated devices, and the cost necessary to achieve that throughput. It is always desirable to reduce the number of steps in a process for forming an integrated device or circuit as long as the integrated circuits or devices suffer no significant degradation in performance as a result thereof. Of course, a process that not only reduces the number of steps required to form an integrated device or circuit, but also increases its electrical performance, would be highly desirable.

In the annealing process it is desirable that the heating of the doped regions be uniform so that all regions are annealed similarly and so perform similarly. An annealing process should therefore have the capability to uniformly anneal doped regions of a substrate.

Another problem related to annealing is the necessity to limit the diffusion of dopant atoms within the circuit. With the ongoing reduction of device dimensions over time to achieve faster switching speeds and to incorporate more devices per unit area within the substrate, it becomes increasingly important to restrict diffusion. Otherwise, the dopant atoms can create leakage paths between source, drain and/or gate regions, which either impair or destroy electrical performance of the integrated device. It would be desirable to provide a method that reduces or eliminates diffusion of the dopant atoms in a substrate.

SUMMARY OF THE INVENTION

The invented apparatus overcomes the above-stated disadvantages. A first method of this invention includes annealing at least one region of a substrate with charged particles. The charged particles can be electrons, protons, ions, alpha particles, or neutral particles. The substrate can be composed of a semiconductor material, for example. The particles can be p-type dopant atoms including boron (B), aluminum (Al), gallium (Ga), indium (In), and palladium (Pd), or n-type dopant atoms species including arsenic (As), phosphorus (P), antimony (Sb), titanium (Ti), platinum (Pt), gold (Au), and oxygen (O). The particles can be used to anneal dopant or other atoms previously implanted into the substrate. Alternatively, the species and energies of the particles can be selected so as to simultaneously implant and anneal the substrate. This alternative implementation of the method requires the particles be a dopant species because implantation and activation are performed in a single step. If no change in the electrical state of the substrate is required, the particles can include atoms with the same valency as the substrate. Such ions include one or more of carbon (C), silicon (Si), and germanium (Ge) or other species with the same valency as the substrate.

The particles can be applied to the substrate with a predetermined flux, energy, pulse duration, and dosage. The energy of the particles can be determined based upon one or more of the following criteria:

(1) the particles have an energy corresponding to an absorption length that is equal to or greater than the desired junction depth;

(2) the particle species is chosen to correspond to the desired dopant and the dose corresponds to the desired doping concentration; and (3) the particles have an energy, flux, and pulse duration to raise the temperature of the irradiated region sufficiently high for annealing or activation to occur.

The energy of the charged particles can range from one-tenth (0.1) to one-hundred (100) kilo-electron-Volts, the range for electrons being from five (5) to seven (7) keV. The charged particle flux generally ranges from $10^{12}$ to $10^{18}$ particles per square centimeter at the surface of the substrate. The particle flux incident on the surface of the substrate can be from $5 \times 10^{12}$ to $5 \times 10^{13}$ particles per square centimeter. The pulse duration of the particles can be from $10^{-9}$ to $10^4$ seconds. However, within the limitations of presently available equipment, the pulse duration of the particles can be in a range from about $5 \times 10^{-7}$ to $10^4$ seconds. The energy dose can be from one-tenth (0.1) to one (1.0) Joules/cm$^2$.

The substrate can include dopants with a predetermined distribution in the substrate and the pulse duration of the particle annealing beam can be limited to prevent significant change in the dopant distribution due to diffusion. The doped region can be amorphous and the underlying substrate can be crystalline. The particle beam can produce a uniform temperature distribution in the amorphous region sufficient to promote crystallization of the amorphous region with the crystalline portion of the substrate acting as a seed crystal. A second method of the invention includes generating particles, accelerating the particles toward a substrate, and focusing the particles to increase the flux of the particles so that they have sufficient flux and energy to anneal a region of the substrate. The particles can include electrons, protons, ions, alpha particles, and other neutral atoms. As with the first method, the second method can be performed with a multicusp generator and an accelerator, and optional focusing lens and beam neutralizer. Most of these elements are contained in a conventional ion implanter. If the particles are dopant species, the energies, the flux and the pulse duration of the particle beam can be selected or arranged to provide the desired dopant concentration and distribution and, possibly, to achieve activation concurrently with irradiation.

It is an object of the invention to provide an apparatus and methods that can be used to produce an even temperature distribution within a doped region undergoing treatment.

It is an object of the invention to provide an apparatus and methods that can be used to anneal a substrate without significantly changing the dopant distribution therein.

These together with other features and advantages, which will become subsequently apparent, reside in the details of the invented apparatus and method as more fully hereinafter described and claimed, reference being made to the accompanying drawings, forming a part hereof, wherein like numerals refer to like parts throughout the several views.

DESCRIPTION OF THE PREFERRED EMBODIMENTS

As used herein, the following terms have the following meanings:

"Absorption length" is a well-known parameter, and is defined as the thickness of a particular material required to reduce the intensity of the energy of the charged particles propagating in such material to 1/e, or 36.8 percent, of its initial intensity.

"Anneal" includes "activation", "crystallization" or "recrystallization" within its scope, and refers to raising and subsequently lowering the temperature of a relatively disordered semiconductor region either to crystallize such region to be integral with a crystalline semiconductor substrate, to activate dopant atoms by incorporating them into the crystalline lattice of the semiconductor region, or to incorporate metal atoms within a semiconductor region to form relatively low-resistance silicide contacts to coupled conductive lines to a terminal of an integrated device formed on a substrate.

"Depth" refers to the distance to which a region extends into the substrate in a direction perpendicular to the substrate's upper major surface as viewed in the perspective of the Figures.

"Disordered region" refers to a semiconductor region in which the atoms contained therein are not relatively ordered either because they are in a non-crystalline state due to damage or amorphization caused by implantation of dopant or non-dopant atoms, and/or because they include dopant atoms that have not been incorporated into the crystalline lattice of such region by activation, for example.

"Energy" refers to the kinetic energy of the charged particles gained by an acceleration applied to an implantation machine.

"Flux" refers to the number of charged particles per unit area (usually expressed in particles per square centimeter units) incident to the top surface of the region of the substrate to be annealed.

"Integrated device" can refer to an active device such as a transistor or diode (including bipolar and complementary metal-insulative semiconductor field-effect transistor (MISFET)), or can refer to a passive device such as a resistor or capacitor. A MISFET includes a complementary metal-oxide field-effect transistor (MOSFET) within its definition.

"Power" as applied to charged particles, is defined as the flux of the charged particles multiplied by the energy of the charged particles, further multiplied by the pulse duration over which the charged particles are applied to the substrate.

"Process" as used herein is broadly defined and generally refers to a method for forming integrated devices or circuits on a substrate.

"Thermal diffusion coefficient" is defined as $k/\rho.C$ where k is the thermal conductivity (J/sec.cm.° C.), $\rho$ is the density (gm/cm$^3$), and C is the heat capacity (J/gm.° C.).

"Thickness" refers to the distance between the upper and lower surfaces of a region in a direction perpendicular to such surfaces as viewed in the perspective of the Figures.

1. First Generalized Embodiment of the Invented Method

Figure 1A:
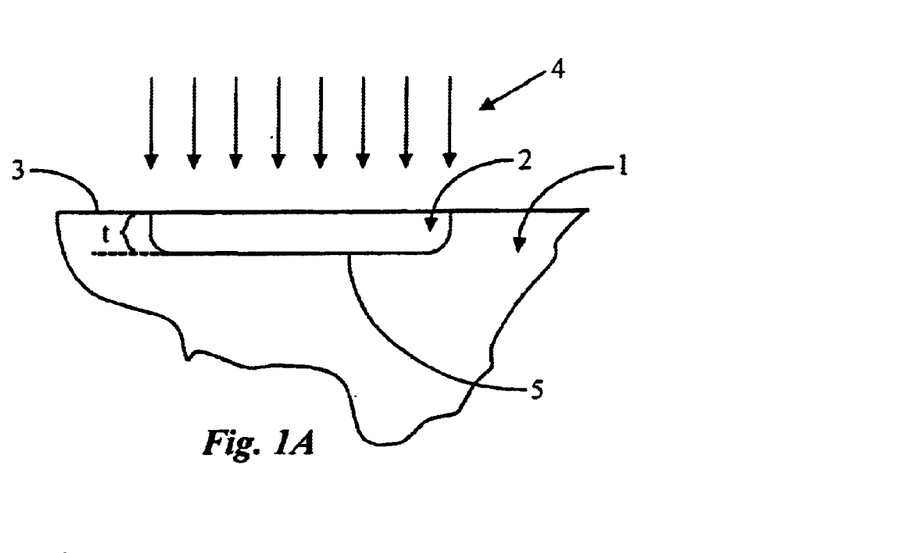
FIGS. 1A-1C are cross-sectional views of a first method of the invention to anneal a region of a substrate with charged particles.
Figure 1B:
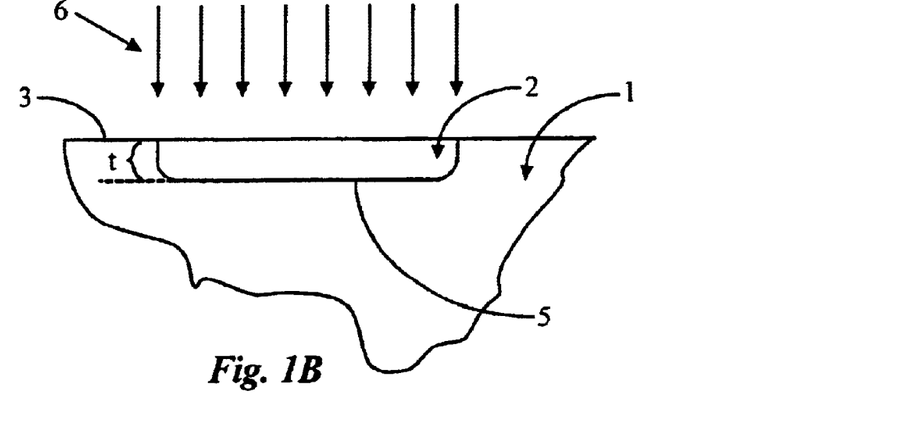
Figure 1C:
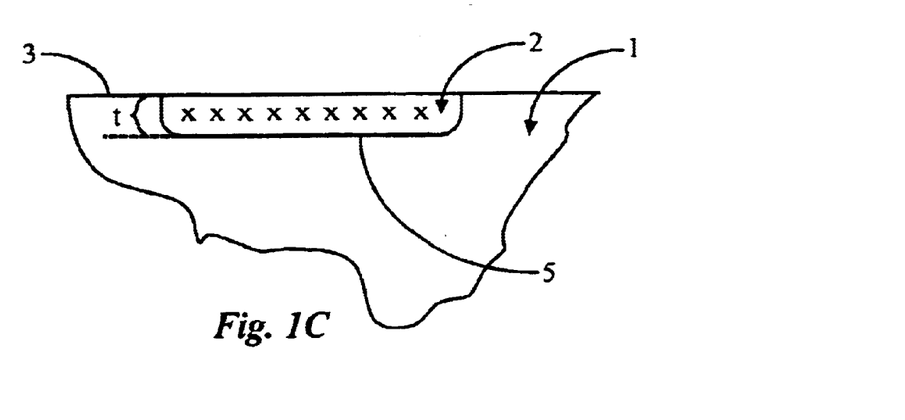

FIGS. 1A-1C are views of a method for annealing a region of a semiconductor substrate using charged particles. The semiconductor substrate 1 can include silicon, gallium arsenide, or other semiconductor material. The substrate 1 can be in the form of a wafer, for example. The wafer can be six, eight, twelve, or sixteen inches in diameter and on the order of seven-hundred-fifty microns in thickness. Alternatively, the substrate 1 can be a layer of semiconductor material formed on an insulative layer or material. For example, the substrate 1 could be a layer of silicon in a silicon-on-insulator (SOI) or a silicon-on-sapphire (SOS) structure. The substrate 1 could also be a relatively thin-film of semiconductor material such as poly-silicon or crystalline silicon formed on an insulative substrate as is used in the manufacture of thin-film transistors for flat panel displays and the like. The major surface 3 of the substrate 1 extends in a direction perpendicular to the plane of FIGS. 1A-1C. Such major surface can be oriented in <100> or <111> directions defined by Miller indices, as is well-known to persons of ordinary skill in this technology.

In FIG. 1A, the substrate 1 is implanted with atoms 4. The atoms 4 are distributed in region 2 of the substrate to a predetermined depth corresponding to the thickness t of the region 2. The major surface 3 of the substrate 1 is the entry point of the particle beam. In general, the greater the atomic weight of such atoms and the less the implantation energy of such atoms, the shallower the depth to which the implanted atoms travel into the substrate 1 relative to its major surface 3. Conversely, the less the atomic weight of the implanted atoms and the greater their implantation energy, the greater the thickness t to which the region 2 extends into the substrate 1.

The method step of FIG. 1A can be used to implant dopant atoms to form a source or drain region of an integrated transistor in the substrate 1, or to form the cathode or anode of a diode, for example. Such step can also be used to implant dopant atoms into the substrate 1 to form an integrated resistor, or conductive portions of an integrated capacitor, or a conductive line extending between terminals of integrated devices that are coupled together, for example. If the implanted atoms are used to dope the region 2 such atoms are either p-type or n-type. For a silicon substrate 1, p-type dopant atoms include boron (B), aluminum (Al), gallium (Ga), indium (In), and palladium (Pd), and n-type dopant atoms species include arsenic (As), phosphorus (P), antimony (Sb), titanium (Ti), platinum (Pt), gold (Au), and oxygen (O). The composition of suicides and the species of refractory metal atoms that can be used to form such suicides are described in, for example, U.S. Pat. No. 5,888,888 issued Mar. 30, 1999 to Somit Talwar et al., which is incorporated herein by reference. In addition the atoms 4 implanted into the region 2 can be electrically neutral species such as silicon (Si) or germanium (Ge) in silicon substrate 1. For example, the atoms can be implanted into the region 2 of the substrate 1 using a device such as the 9500 XR Ion Implanter machine commercially-available from Applied Materials, Inc. of San Jose, Calif.

The implantation of the atoms of FIG. 1A into the substrate 1 damages the crystallinity of the substrate in the region 2 affected by the implanted atoms. More specifically, the implanted atoms collide with atoms of the substrate 1 and break chemical bonds between some of the substrate atoms, rendering the substrate atoms relatively disordered in the region 2. The atoms in the region 2 can be so disordered as to be considered 'amorphous' and thus lacking any significant crystallinity. In addition, the implanted atoms are generally not positioned within the crystalline lattice of the substrate 1 within the region 2 immediately after they are implanted. If the implanted atoms are dopant species it is especially important to anneal the region 2 to restore the crystallinity of the substrate 1 and to position at least some of the implanted atoms at sites within the lattice of the semiconductor material. Otherwise, the region 2 may not exhibit the desired electrical performance upon application of electric current/voltage thereto. Accordingly, the region 2 must be annealed to obtain proper electrical performance. The manner of accomplishing this in the subject method is now described with reference to FIG. 1B.

Importantly, in FIG. 1B, the method includes a step of annealing the region 2 with particles. The particles can be electrons, protons, ions, alpha particles, or neutral atoms. The different types of atoms that can be used in this step can include virtually any ion that does not adversely affect electrical performance. Such atoms can include dopant species such as boron (B), aluminum (Al), gallium (Ga), indium (In), and palladium (Pd), arsenic (As), phosphorus (P), antimony (Sb), titanium (Ti), platinum (Pt), gold (Au), and oxygen (O). The atom species can also be one that is electrically neutral such as silicon (Si), or germanium (Ge). These atomic species have the same valence as common substrate materials such as silicon and thus have no significant impact upon the electrical characteristics of the region 2. Other atomic species include the noble gases such as helium (He), neon (N), argon (Ar), xenon (Xe), or krypton (Kr), for example. Hydrogen (H) and nitrogen (N) are also candidates. These gaseous species provide the advantage of being relatively easy to ionize. Fluorine (F) and chlorine (Cl) could also be used but are generally less preferred because of their toxic and highly reactive natures. Sodium (Na) and potassium (K) are generally shunned for use in semiconductor materials because they adversely affect electrical performance of integrated devices. Because the flux of the charged particles necessary to anneal the region 2 is relatively small (approximately $10^{13}$ to $10^{18}$ particles per square centimeter) almost any atomic species can be used to anneal the region 2 of the substrate 1.

The energy, flux, and pulse duration of the particle beam 6 that is required to anneal the region 2 generally depends upon the thickness t of the region 2 and the type of material composing such region 2. In general the greater the energy of the particles, the greater the thickness t to which the particles can anneal the region 2. Conversely, the less the energy of the particles the less the thickness t to which the region 2 extends.

Exemplary ranges for the energy, flux, and pulse duration of the particles 6 applied to anneal the region 2 are as follows. The energy of the charged particles 6 can range from one-tenth (0.1) to one-hundred (100) kilo-electron Volts, the most preferred range being from five (5) to seven (7) keV for electrons. The charged particle dose generally ranges from $10^{12}$ to $10^{18}$ particles per square centimeter at the surface 3 of the substrate 1. Determination of the pulse duration of the particle irradiation 6 to be applied to the region 2 should utilize the following considerations. In general, it is desirable to heat the region 2 uniformly from surface 3 to lower surface 5 of the dopant profile. The pulse duration should also be sufficiently limited so that minimal dopant diffusion occurs and so that the thermal diffusion length is limited to the desired annealing depth or by practical limitations of the equipment. This minimizes the power required to anneal the region. In general, the pulse duration can be from $10^{-9}$ to $10^{-4}$ seconds. However, commercially-available implantation equipment limits the pulse duration to a range from about $5\times10^{-7}$ to $10^4$ seconds. With implantation equipment currently available greater implant voltages and longer pulse times than the most preferred pulse duration are required. Nonetheless, effective annealing can be performed with the limitations of commercially-available equipment.

For example, if the thickness t is one-hundred (100) nanometers and electrons are used for the particles 6, a six (6) kiloelectronVolt (keV) electron beam that is pulsed for one (1) microsecond can be used which penetrates four-tenths (0.4) microns into the substrate 1. Such penetration depth is four times the thickness t of the region 2. In this case thermal diffusion resulting from the electrons heats the substrate to nine-and-one-half (9.5) microns, which is much thicker than the thickness t. Nonetheless, the pulse duration is sufficiently short to anneal the region 2 without degradation in the dopant profile.

As another example protons can be used as the particles 6 with an energy of 6 keV. If the thickness t of the region 2 is one-hundred (100) nanometers the proton range into the substrate 1 is about the same as the thickness t of the region 2. The thermal diffusion length for the protons in this example is 9.5 microns for a pulse duration of one (1) microsecond, almost one hundred times as great as the thickness of the region 2 in this example. However the pulse duration is sufficiently short to prevent dopant diffusion beyond the region 2.

Particles larger than protons would be even less penetrating into the substrate but limitations of commercially-available equipment would limit the pulse duration to the microsecond region.

The following tables illustrate range versus kinetic energy for various charged particles in a silicon substrate:

TABLE 1

Range of Protons in Silicon

| Kinetic Energy (keV) | Range (microns) |
| --- | --- |
| 6 | 0.08 |
| 12 | 0.15 |
| 18 | 0.20 |

TABLE 2

Range of Electrons in Silicon

| Kinetic Energy (keV) | Range (microns) |
| --- | --- |
| 6 | 0.4 |
| 12 | 1.1 |
| 18 | 2.2 |

TABLE 3

Range of Alpha Particles in Silicon

| Kinetic Energy (keV) | Range (microns) |
| --- | --- |
| 6 | 0.063 |
| 12 | 0.12 |
| 18 | 0.18 |

Determining kinetic energies corresponding to other ranges than those stated above can be performed by interpolation or extrapolation of the kinetic energies and ranges. In addition such information is available from numerous sources including National Institutes of Standards (NIST) and others.

The exposure of the region 2 to the particle beam 6 heats the region to near its melting point so that the atoms therein can rearrange themselves into a relatively ordered state as compared to that resulting from performance of the implanting step in FIG. A. Therefore if the region 2 contains dopant atoms such atoms rearrange themselves with the substrate atoms so that the dopant atoms are electrically active.

If the region 2 is composed of amorphous atoms of the substrate material and the substrate 1 is crystalline, the power imparted by the particle beam 6 can be sufficient to trigger the recrystalization of the region 2 to the surface 5. Depending on the temperature distribution in the amorphous region the substrate 1 can act as a seed upon which the region 2 crystallizes so that is crystallographically integral with the substrate 1. In FIG. 1C, the region 2 is illustrated with 'x' hatching to indicate that such region is relatively ordered after annealing with the charged particles 6.

Figure 2A:
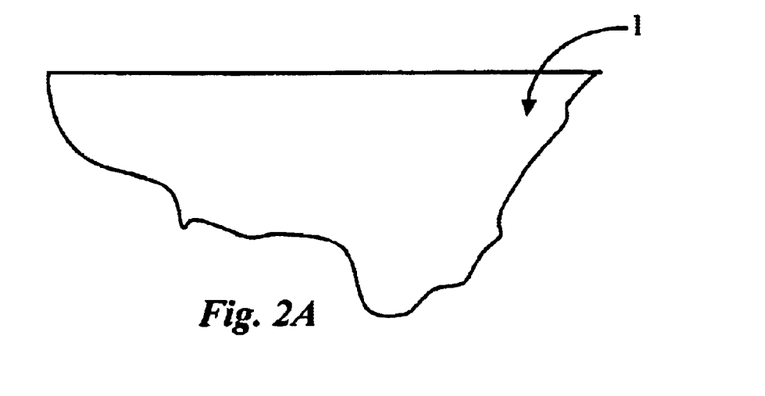
FIGS. 2A-2C are cross-sectional views of a second method of the invention to implant and anneal a region of a substrate with charged particles.
Figure 2B:
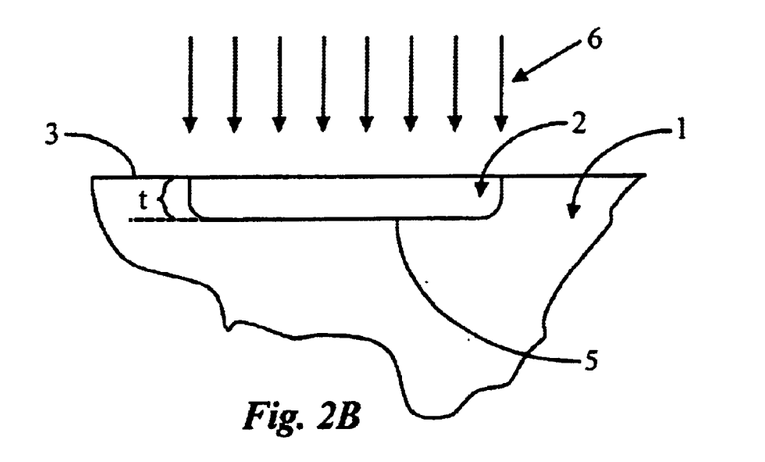
Figure 2C:
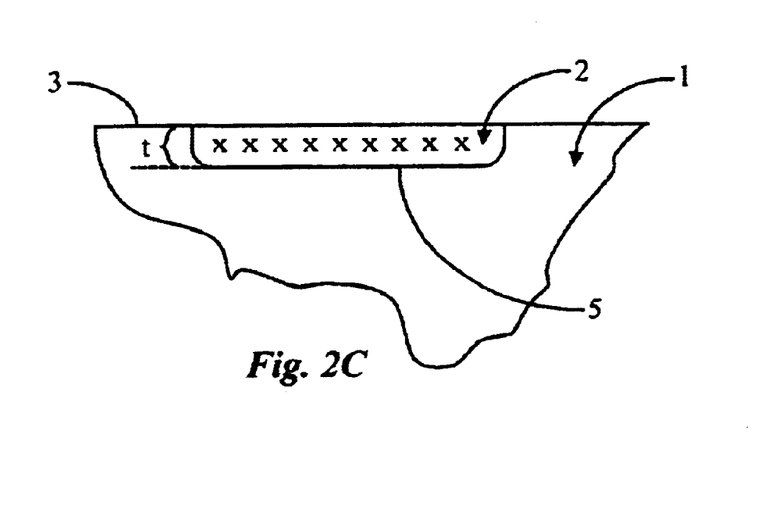

FIGS. 2A-2C are a second embodiment of the invented method. In FIG. 2A, the substrate 1 is shown in its initial state before performance of the second embodiment of the method. In FIG. 2B, particles 6 are implanted into the substrate 1 to form the region 2. The particles 6 can be a dopant. The energy, flux, and pulse duration of the particle beam 6 is sufficient to implant these particles into the region 2, and also to anneal the region. Accordingly the region 2 can be doped and activated in one step, a significant advantage over previous methods. In FIG. 2C, the region 2 crystallizes after being triggered by the charged particle beam 6 so that the region 2 crystallizes with in a relatively ordered form represented by the 'x' hatching in FIG. 2C.

Figure 3:
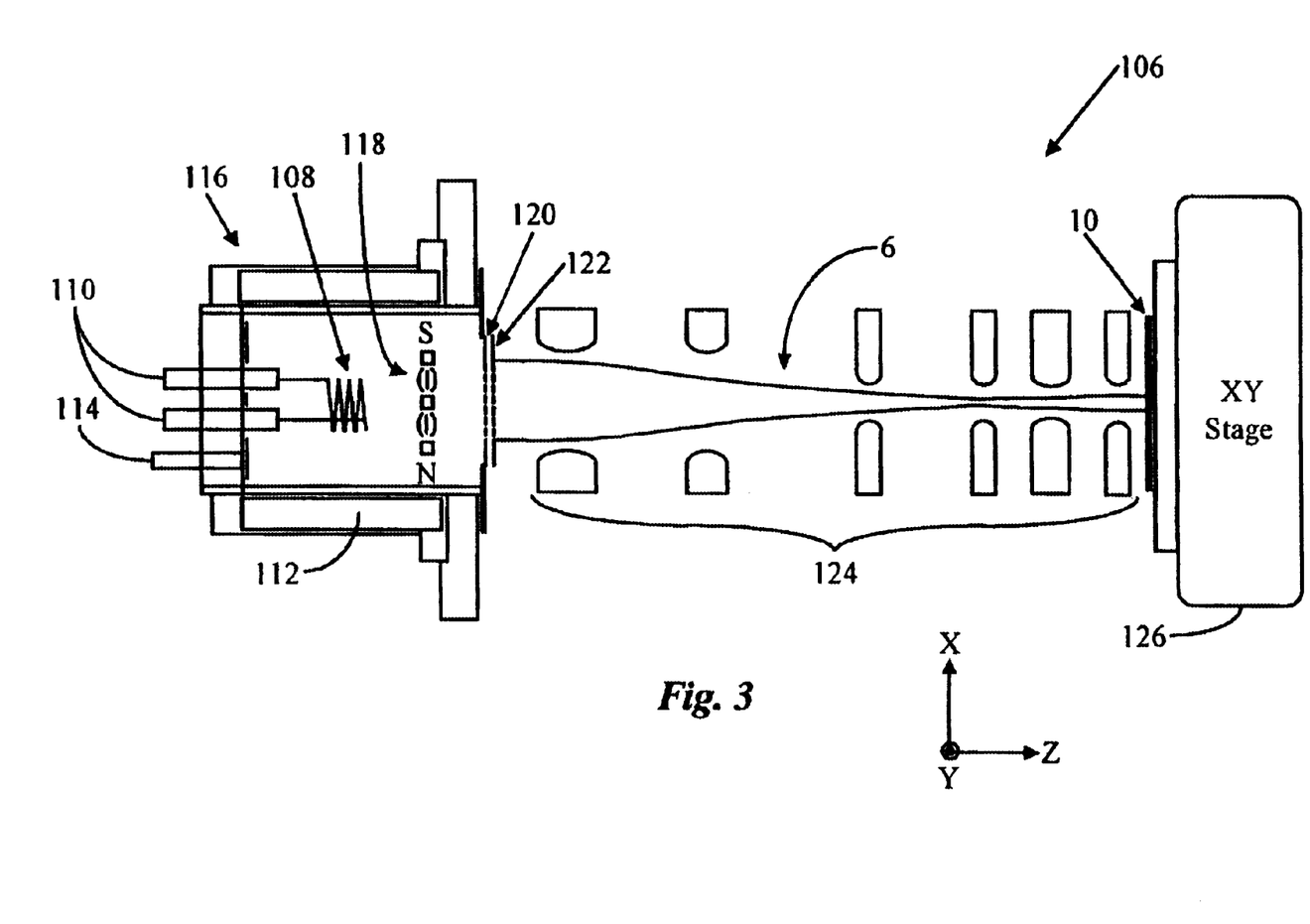
FIG. 3 is a cross-sectional view of an apparatus used to generate, accelerate, and focus charged particles on a substrate.

An option for the generation of electrons, protons, or other ions is a multicusp plasma generator 106 shown in FIG. 3. The multicusp generator 106 includes an element 108 that can be a direct current (DC) or radio-frequency (RF) element. The element 108 is coupled to a DC or RF source via conductors 110. The water-cooled jacket 112 surrounds the element 108 and circulates a flow of coolant such as water to cool portions of the generator 106 relatively near the element 108. The conduit 114 is coupled to a pressurized gas source to receive an atomic species from which plasma is to be generated by the element 108 within enclosure 116. Such gas source can include hydrogen, helium, neon, nitrogen, oxygen, argon, xenon, or krypton, for example. The generator 106 also includes a magnetic filter 118 that generates a relatively uniform density of the charged particles 6, at a central area thereof. The apparatus 106 further includes extractor electrodes 120, 122 to extract charged particles from the enclosure 116. The electrode 120 is coupled to an electrically positive voltage source to accelerate electrons or negative ions generated within the enclosure 116 via the element 108. The electrode 122 is coupled to an electrically negative voltage source to accelerate protons or positive ions generated by the element 108. The apparatus 106 can include an accelerator unit 124 that includes spaced electrodes that apply either positive or negative voltage appropriate for the charged particles to accelerate such particles. The accelerator unit 124 also focuses the charged particles so that their flux is increased several fold (for example, twenty) upon exiting the enclosure 116. The focused, charged particle beam 6, may, after acceleration, be neutralized by the addition of opposite charge before striking the substrate 10 on x-y stage 126 with sufficient energy to anneal regions thereof.

Figure 4:
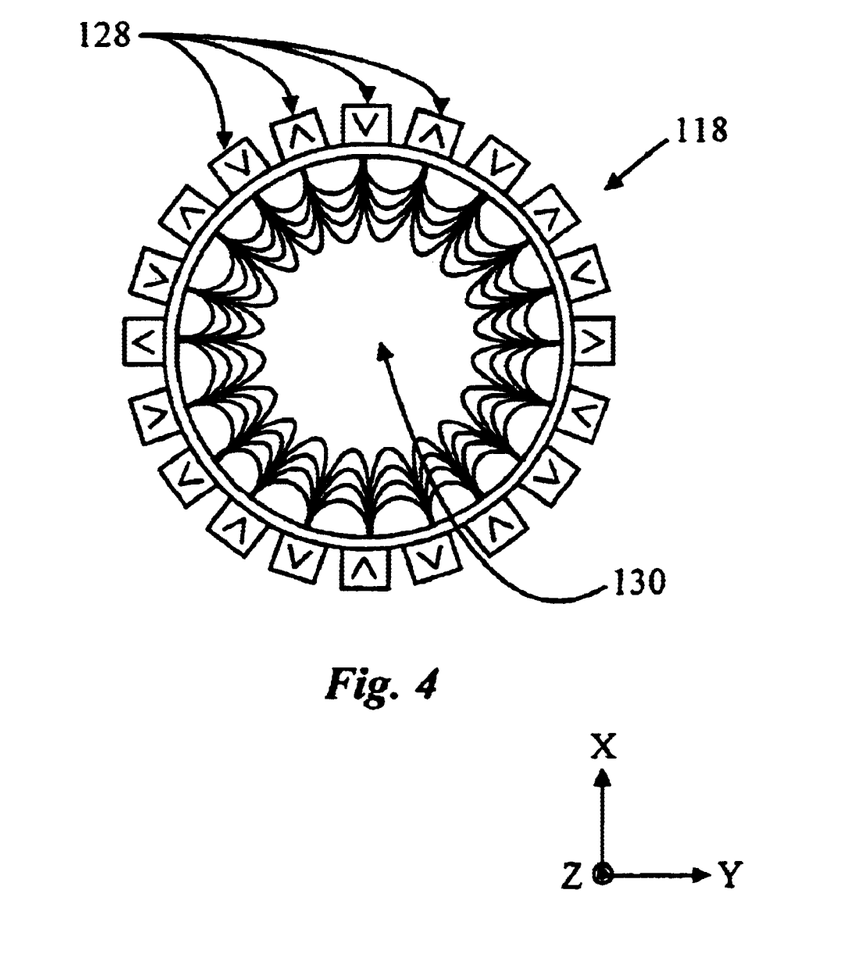
FIG. 4 is a cross-sectional view of a magnetic filter of the apparatus of FIG. 3.

In FIG. 4, a cross-section of the magnetic filter 118 is shown. The magnetic filter 118 includes permanent magnets 128 arranged at constant radial intervals in a circular arrangement in which the poles of adjacent magnets are reversed relative to one another. The permanent magnets 128 generate magnetic-field cusps that render the density of the charged particles in the central portion 130 relatively uniform. The energy distribution of the charged particles at the substrate 10 can be rendered relatively uniform using the magnetic filter 118.

In operation a gas flow from which plasma is to be generated is introduced into the enclosure 116. The element 108 is activated by application of DC or RF voltage/current thereto via conductors 110 to excite the gas present in the enclosure 116 to generate plasma. Either a positive voltage is applied to the electrode 120 or a negative voltage is applied to the electrode 122, depending upon whether the charged particles desired to be used have positive or negative charges. Voltage is also applied to the elements of the accelerator unit 124 to accelerate and focus the charged particles at the substrate 10. The charged particles collide with and anneal one or more regions of the substrate 10.

The many features and advantages of the present invention are apparent from the detailed specification and thus, it is intended by the appended claims to cover all such features and advantages of the described methods and article produced thereby which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. A method comprising the step of annealing at least one region of a semiconductor substrate while minimizing the diffusion of dopant atoms during activation by using a pulsed beam of particles having a time duration less than or equal to $10^{-4}$ seconds, said particles including electrons, protons, ions, alpha particles and neutral atoms.

2. A method as claimed in claim 1 wherein the substrate includes an amorphous region positioned in contact with the substrate and the particle beam heats the amorphous region sufficiently to convert the amorphous region into a crystalline region with a crystal orientation aligned to the crystal orientation of the substrate due to the substrate acting as a seed for the crystalline region.

3. A method as claimed in claim 1 wherein the particles in the beam include ionized gas molecules.

4. A method as claimed in claim 1 wherein the particles in the beam include molecules containing a dopant atomic species.

5. A method as claimed in claim 1 wherein the particles contain a predetermined dopant atomic species, the energy of the particles is sufficient to implant the dopant atomic species to a predetermined depth, the dose of particles is sufficient to produce a predetermined dopant concentration in the substrate, and the pulse duration of the beam of particles is sufficiently short to anneal the implanted region of the substrate.

6. A method as claimed in claim 1 wherein the particles contain a predetermined dopant species implanted with a predetermined energy that produces a doped region in the substrate extending to a doping depth, and thermal energy imparted by the particles has a diffusion length over the duration of the particle beam pulse that is less than 100 microns.

7. A method as claimed in claim 1 wherein the particles include at least one atom of boron (B), aluminum (Al), gallium (Ga), indium (In), arsenic (As), phosphorus (P), or antimony (Sb).

8. A method as claimed in claim 1 wherein the particles have the same valency as the substrate.

9. A method as claimed in claim 8 wherein the substrate is composed of silicon, and the particles include at least one atom of silicon (Si) or germanium (Ge).

10. A method as claimed in claim 1 wherein the particles are produced from a gas including at least one of hydrogen (H), helium (He), neon (Ne), nitrogen (N), oxygen (O), argon (Ar), xenon (Xe), and krypton (Kr).

11. A method as claimed in claim 1 wherein the energy of the particles is in a range from one-tenth (0.1) to one-hundred (100) kilo-electron-Volts.

12. A method as claimed in claim 1 wherein the energy of the particles is in a range from five (5) to seven (7) kilo-electron-Volts.

13. A method as claimed in claim 1 wherein the particle dose ranges from $10^{12}$ to $10^{11}$ particles per square centimeter at the surface of the substrate.

14. A method as claimed in claim 1 wherein the dose of particles ranges from $5 \times 10^{12}$ to $5 \times 10^{13}$ particles per square centimeter at the substrate.

15. A method as claimed in claim 1 wherein the energy dose of a single pulse of the particles is from one-tenth (0.1) to one (1.0) Joules/$cm^2$.

16. A method as claimed in claim 1 wherein the substrate includes at least one relatively disordered region in contact with a relatively ordered region of the substrate, and the energy of the particles is sufficient to heat the disordered region through to the ordered region so that the disordered region recrystallizes with the same crystallographic orientation as the relatively ordered region of the substrate.

17. A method as claimed in claim 1 wherein the substrate includes a semiconductor material.

18. A method as claimed in claim 1 wherein the substrate includes silicon.

19. A method as claimed in claim 1 wherein the substrate includes a relatively thin layer of semiconductor material on an insulative material.

20. A method as claimed in claim 1 wherein the substrate includes dopant atoms and the particle beam heats and melts the substrate so that the dopant atoms are incorporated into the substrate on recrystallization.

21. A method comprising the steps of:
   a) generating a pulse of charged particles having a time duration between $10^{-7}$ and $10^{-4}$ seconds;
   b) accelerating the charged particles toward a substrate; and
   c) concentrating the charged particles to increase the flux of the particles to produce a dose sufficient to anneal a region of the substrate in the duration of the pulse.

22. A method as claimed in claim 21 wherein steps (a)–(c)) are performed with a multicusp generator.

23. A method as claimed in claim 21 wherein the charged particles include electrons.

24. A method as claimed in claim 21 wherein the charged particles include protons.

25. A method as claimed in claim 21 wherein the charged particles include ions, the method further comprising the step of:
   d) ionizing a gas to produce the ions.

26. A method as claimed in claim 25 wherein the ions include a predetermined dopant atomic species contained in the ionized gas.

27. A method as claimed in claim 26 wherein energies of the ions are sufficient to dope the implanted region of the substrate to a predetermined depth.

28. A method as claimed in claim 26 wherein the dose of implanted ions is sufficient to produce a predetermined dopant concentration in the substrate.

29. A method as claimed in claim 25 wherein the dose, energy, and pulse duration of the particles is sufficient to anneal the doped region of the substrate.

30. A method as claimed in claim 25 wherein the ions include at least one atom of boron (B), aluminum (Al), gallium (Ga), indium (In), arsenic (As), phosphorus (P), or antimony (Sb).

31. A method as claimed in claim 25 wherein the ions include at least one of silicon (Si) and germanium (Ge).

32. A method as claimed in claim 25 wherein the ions are produced from a gas including at least one of hydrogen (H), helium (He), neon (Ne), nitrogen (N), oxygen (O), argon (Ar), xenon (Xe), and krypton (Kr).

33. A method as claimed in claim 21 wherein the charged particles include alpha particles.

34. A method as claimed in claim 21 wherein the energy of the charged particles is in a range from one-tenth (0.1) to one-hundred (100) kilo-electron-Volts.

35. A method as claimed in claim 21, wherein the energy of the charged particles is in a range from five (5) to seven (7) kilo-electron-Volts.

36. A method as claimed in claim 21 wherein the particle dose ranges from $10^{12}$ to $10^{18}$ particles per square centimeter at the surface of the substrate.

37. A method as claimed in claim 21 wherein the dose of particles ranges from $5 \times 10^{12}$ to $5 \times 10^{13}$ particles per square centimeter.

38. A method as claimed in claim 21 wherein the particles are applied to the substrate in a pulse, and the pulse duration of the particles is from $10^{-9}$ to $10^{-4}$ seconds.

39. A method as claimed in claim 21 wherein the particles are applied to the substrate in a pulse, and the pulse duration of the particles is from $5 \times 10^{-7}$ to $5 \times 10^{-6}$ seconds.

40. A method as claimed in claim 21 wherein the energy dose can be in a range from one-tenth (0.1) to one (1.0) Joules/cm².

41. A method as claimed in claim 21 wherein the substrate includes an amorphous region positioned in contact with the substrate and the charged particles heat the amorphous region sufficiently trigger recrystallization of the amorphous region through to the crystalline substrate so that the new crystalline material has the same crystallographic orientation as the substrate.

42. A method as claimed in claim 21, wherein the substrate includes a semiconductor material.

43. A method as claimed in claim 21 wherein the substrate includes silicon.

44. A method as claimed in claim 21 wherein the substrate includes a relatively thin layer of semiconductor material on an insulative material.

45. A method as claimed in claim 21 wherein the substrate includes dopant atoms and the particle beam heats and melts the substrate so that the dopant atoms are incorporated into the substrate so as to be electrically-active upon cooling and recrystallization of the substrate.

46. A method for implanting dopant atoms into a semiconductor substrate comprising the step of directing a beam of dopant atoms to a surface of the semiconductor substrate with sufficient energy so that the dopant atoms are distributed to a predetermined depth from the surface of the substrate, the energy, dose and pulse duration imparted by the beam of dopant atoms being sufficient to raise the temperature of the substrate atoms to permit annealing of the dopant atoms.

47. A method comprising the steps of annealing at least one integrated device formed in a semiconductor substrate while minimizing the diffusion of dopant atoms during activation by using a pulsed beam of particles having a duration between $10^{-10}$ seconds and $10^{-4}$ seconds, said particles including electrons, protons, ions, alpha particles and neutral atoms.

48. A method as claimed in claim 47 wherein the particles include a predetermined species of dopant atom, the energies of the particles are sufficient to implant to the predetermined depth, and the energy, dose, and pulse duration are predetermined to anneal the implanted region of the substrate.

49. A method as claimed in claim 47 wherein the ions are implanted with an energy that produces a doped region in the substrate extending to a predetermined depth and the thermal energy imparted by the ions has a diffusion length, during the duration of the pulse, that is less than one-hundred (100) microns.

50. A method as claimed in claim 47 wherein the ions include at least one boron (B), aluminum (Al), gallium (Ga), indium (In), arsenic (As), phosphorus (P), and antimony (Sb).

51. A method as claimed in claim 47 wherein the particles include at least one atom of silicon (Si) and germanium (Ge).

52. A method as claimed in claim 47 wherein the particles are produced from a gas including at least one of hydrogen (H), helium (He), neon (Ne), nitrogen (N), oxygen (O), argon (Ar), xenon (Xe), and krypton (Kr).

53. A method as claimed in claim 47 wherein the particles include alpha particles.

54. A method as claimed in claim 47 wherein the energy of the particles is in a range from one-tenth (0.1) to one-hundred (100) kilo-electron-Volts.

55. A method as claimed in claim 47 wherein the energy of the particles is in a range from five (5) to seven (7) kilo-electron-Volts.

56. A method as claimed in claim 47 wherein the particle dose ranges from $10^{12}$ to $10^{18}$ particles per square centimeter at the surface of the substrate.

57. A method as claimed in claim 47 wherein a dose of particles ranges from $5 \times 10^{12}$ to $5 \times 10^{13}$ particles per square centimeter.

58. A method as claimed in claim 47 wherein the particles are applied to the substrate in a pulse, and the pulse duration of the particles is from $10^{-9}$ to $10^{-4}$ seconds.

59. A method as claimed in claim 47 wherein the particles are applied to the substrate in a pulse, and the pulse duration of the particles is from $5 \times 10^{-7}$ to $5 \times 10^{-6}$ seconds.

60. A method as claimed in claim 47 wherein the dosage of energy can be from one-tenth (0.1) to one (1.0) Joules/cm².

61. A method as claimed in claim 47 wherein the substrate includes at least one relatively disordered region in contact with a relatively ordered region of the substrate, and the energy of the particles, the dose and the pulse duration is sufficient to heat the disordered region through to the ordered region so that the disordered region recrystallizes with the same crystallographic orientation as the relatively ordered region of the substrate.

62. A method as claimed in claim 47 wherein the substrate includes a semiconductor material.

63. A method as claimed in claim 47 wherein the substrate includes silicon.

64. A method as claimed in claim 47 wherein the substrate includes a relatively thin layer of semiconductor material on an insulative substrate.

65. A method as claimed in claim 47 wherein the substrate includes dopant atoms and the particles heat and melt the substrate so that the dopant atoms are incorporated into the crystalline structure of the substrate so as to be electrically-active upon cooling of the substrate.

* * * * *